(12) United States Patent
Wang

(10) Patent No.: US 9,111,606 B2
(45) Date of Patent: Aug. 18, 2015

(54) TRACKING BIT CELL

(71) Applicant: TAIWAN SEMICONDUCTOR MANUFACTURING COMPANY, LTD., Hsinchu (TW)

(72) Inventor: Bing Wang, Palo Alto, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/570,259

(22) Filed: Dec. 15, 2014

(65) Prior Publication Data

US 2015/0098280 A1    Apr. 9, 2015

Related U.S. Application Data

(62) Division of application No. 13/273,705, filed on Oct. 14, 2011, now Pat. No. 8,934,308.

(51) Int. Cl.
*G11C 7/22*    (2006.01)

(52) U.S. Cl.
CPC . *G11C 7/22* (2013.01); *G11C 7/227* (2013.01)

(58) Field of Classification Search
CPC .. G11C 7/227; G11C 11/419; G11C 11/4099; G11C 16/28; G11C 7/14; G11C 7/22
USPC ............... 365/185.2, 210.1, 191, 154–156
See application file for complete search history.

(56) References Cited

U.S. PATENT DOCUMENTS

| | | |
|---|---|---|
| 2002/0105824 A1 | 8/2002 | Houston |
| 2006/0028889 A1* | 2/2006 | Liaw .............................. 365/209 |
| 2007/0008771 A1* | 1/2007 | Lee et al. ........................ 365/154 |
| 2007/0109895 A1* | 5/2007 | Tokito ............................ 365/210 |
| 2007/0297270 A1 | 12/2007 | Komatsu et al. |
| 2008/0298143 A1* | 12/2008 | Chen et al. ..................... 365/194 |
| 2009/0027947 A1 | 1/2009 | Takeda |
| 2010/0177580 A1 | 7/2010 | Komatsu et al. |
| 2012/0206986 A1 | 8/2012 | Wang |

* cited by examiner

*Primary Examiner* — Richard Elms
*Assistant Examiner* — Khamdan Alrobaie
(74) *Attorney, Agent, or Firm* — Lowe Hauptman & Ham, LLP

(57) ABSTRACT

A method includes determining a plurality of first current values of a first current to be sunk by a tracking cell of a tracking circuit in response to a plurality of first voltage values of a first voltage applied to the tracking cell. Each first current value of the plurality of first current values thereby corresponds to a first voltage value of the plurality of first voltage values. A second current value of a second current is determined. The second current value corresponds to a second voltage value of a second voltage of a memory cell of a plurality of memory cells. A third voltage value is selected based on the second current value, a first current value of the plurality of first current values, and a first voltage value corresponding to the first current value.

20 Claims, 11 Drawing Sheets

800A

| | ITRACKING (µa) | VOLTAGE (v) |
|---|---|---|
| 805 | 30 | 0.9 |
| 810 | 20 | 0.8 |
| 815 | 10 | 0.7 |
| 820 | 5 | 0.6 |

| | IWEAK (µa) | VOLTAGE (v) |
|---|---|---|
| 855 | 20 | 0.9 |
| 860 | 10 | 0.8 |
| 865 | 5 | 0.7 |
| 870 | 1 | 0.6 |

FIG. 8B

TRACKING BIT CELL

PRIORITY CLAIM

The present application is a divisional of U.S. application Ser. No. 13/273,705, filed Oct. 14, 2011, which is incorporated herein by reference in its entirety.

FIELD

The present disclosure is related to a tracking memory cell or bit cell.

BACKGROUND

Memory cells have different read speeds. Some memory cells are "regular" or have an average read speed. Some memory cells are faster than an average memory cell or have a read speed value lower than an average read speed value. A fast (faster) memory cell is commonly called a strong memory cell. In contrast, some memory cells are slower than the average memory cell or have a read speed value higher than the average read speed value. In other words, slow memory cells have a larger read timing. A slow (slower) memory cell is commonly called a weak memory cell. Generally, a strong memory cell sinks and/or sources a higher current, while a weak memory cell sinks and/or sources a lower current. As a result, the read speed of a memory cell can be identified by the current sunk and/or sourced by the memory cell.

Tracking circuits have tracking cells that are used to generate tracking or reference signals based on which signals for reading memory cells are generated. Similar to a memory cell, a tracking cell has a different read speed identified by the current sunk and/or sourced by the tracking cell. In some approaches, tracking cells in a tracking circuit are designed to sink currents and generate tracking timings to cover timings for the weak memory cells. In many situations, using the average current value of the tracking cells may not cover the larger timing of the weak memory cells.

BRIEF DESCRIPTION OF THE DRAWINGS

The details of one or more embodiments of the disclosure are set forth in the accompanying drawings and the description below. Other features and advantages will be apparent from the description, drawings, and claims.

FIGS. 8A and 8B are tables of data used to illustrate how a reduced voltage for tracking cells in a tracking circuit is determined, in accordance with some embodiments.

Like reference symbols in the various drawings indicate like elements.

DETAILED DESCRIPTION

Figure 1:
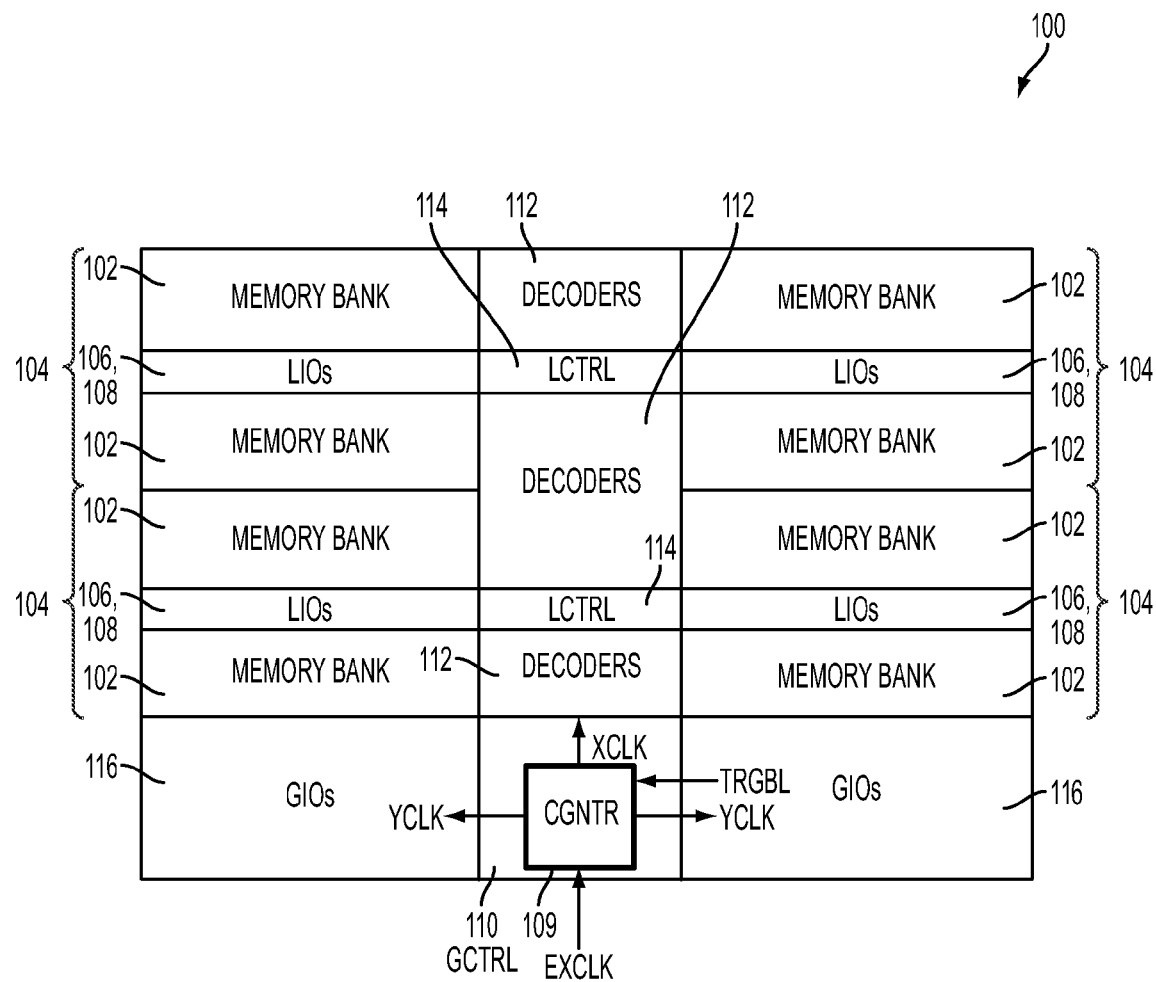
FIG. 1 is a block diagram of an SRAM macro, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. An operational voltage VDDR for use by tracking cells in a tracking circuit is reduced compared with a regular operational voltage VDD used by the memory cells and other circuits in a memory macro. The operational behavior of the tracking cells is therefore similar to that of weak tracking cells. As a result, the timing generated by the tracking circuit covers the slow timing experienced by the weak (or weakest) memory cells. The reduced operational voltage VDDR is adjustable. As a result, different voltage levels for voltage VDDR can be used for tracking different memory cell arrays. Because the reduced voltage level VDDR is independent from process or temperature variations, one value setting for voltage VDDR is used for different process, voltage, and temperature (PVT) corners. The reduced voltage VDDR value is used for DC biasing the tracking cells. In many situations, the number of tracking cells is small. As a result, the voltage source to generate the reduced voltage VDDR is easy to design. At lower VDD operations, the reduced voltage VDDR provides a good tracking timing for weak memory cells.

Exemplary SRAM Macro

FIG. 1 is a block diagram of a static random access memory (SRAM) macro 100, in accordance with some embodiments. In this document "rise" refers to transitioning from a low logic value to a high logic value, and "fall" refers to transitioning from a high logic value to a low logic value.

Figure 2:
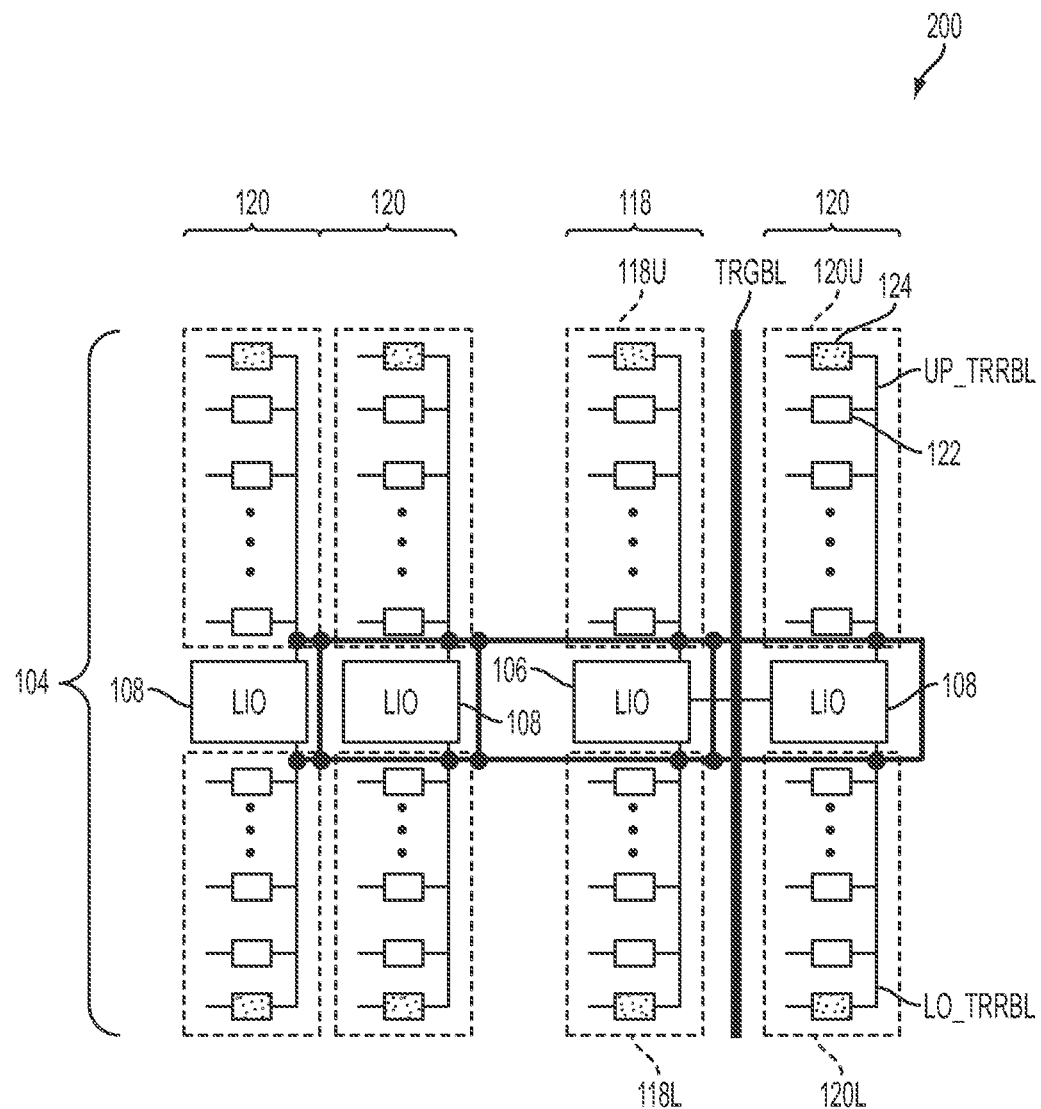
FIG. 2 is a diagram of a tracking circuit, in accordance with some embodiments.

Memory macro 100 includes a plurality of memory segments 104. Four memory segments 104 are shown for illustration. A different number of memory segments 104 is within the scope of various embodiments. Each segment 104 includes two memory banks 102 sharing a row of a plurality of local input-output circuits (LIOs) 106 and 108. Different configurations of a memory segment are within the scope of various embodiments. Each memory bank 102 includes a plurality of memory cells 122 and a plurality of tracking cells 124. Memory cells 122 and tracking cells 124 are shown in FIG. 2.

Address decoders 112 provide the X- or row-address of memory cells 122 to be accessed for a read or a write operation.

Local control circuits (LCTRLs) 114 control LIOs 106 and 108, including, for example, turning on and off the read word lines and write word lines of the memory cells.

Global inputs/outputs (GIOs) 116 serve to transfer data between the memory cells and other circuits outside of memory macro 100.

Global control circuit (GCTRL) 110 provides the address pre-decode, clock, and other signals for memory macro 100. GCTRL 110 includes a Y-decoder (not shown) that provides the Y- or column address of a memory cell. GCTRL 110 controls reading and writing operations or the data transfer between memory cells 122 to circuits outside of memory macro 100.

In some embodiments, clock generator (CGNTR) 109 receives an external clock EXCLK and tracking global bit line TRGBL as inputs and generates an internal clock ICLK (not shown). Based on internal clock ICLK, clock generator 109 generates a clock XCLK running in the X decoders 112 direction and two clocks YCLK running in the Y decoders (not shown) or in the directions of GIOs 116. Clock XCLK is part of a tracking path in the X-decoder directions while clock YCLK is part a tracking path in the Y-decoder direction.

Exemplary Tracking Circuit

FIG. 2 is a diagram of various elements of a segment 104 illustrating a tracking circuit 200, in accordance with some embodiments. For simplicity, one memory cell 122 of various memory cells 122 and one tracking cell 124 of eight tracking cells 124 are labeled. One column 120U of three columns 120U and one column 120L of three columns 120L are labeled. One upper tracking read bit line of four tracking read bit lines UP_TRRBL, and one lower tracking read bit line of four tracking read bit lines LO_TRRBL are labeled.

Tracking circuit 200 includes one column 118 and three columns 120. Each column 120 includes one LIO 108 with an upper column 120U and a lower column 120L. Each column 120U includes a plurality of memory cells 122 and one tracking cell 124 coupled to an upper tracking read bit line UP_TRRBL. Each column 120L includes a plurality of memory cells 122 and one tracking cell 124 coupled to a lower tracking read bit line LO_TRRBL. A column 118 includes one LIO 106 with an upper column 118U and a lower column 118L. Column 118U includes a plurality of memory cells 122 and one tracking cell 124 coupled to an upper tracking read bit line UP_TRRBL. Column 118L includes a plurality of memory cells 122 and one tracking cell 124 coupled to a lower tracking read bit line LO_TRRBL.

In some embodiments, upper tracking read bit lines UP_TRRBL and lower tracking read bit lines LO_TRRBL of all three columns 120 and of column 118 are coupled together. Upper tracking bit lines UP_TRRBL, lower tracking bit lines LO_TRRBL, and a tracking global bit line TRGBL are coupled to a tracking LIO 106. Column 118 and one column 120 are on the right side of memory macro 100, and the other two columns 120 are on the left hand side of memory macro 100. Different locations of column 118 and/or columns 120 are within the scope of various embodiments. Different relative locations of a column 118 and 120 are within the scope of various embodiments. For example, two columns 120 and a pair of a column 118 and a column 120 may be next to one another as shown in FIG. 2, but they may be separated by one or a plurality of columns of regular memory cells 122.

Columns 120 are used to create the load for column 118. Three columns 120 are used for illustrations, a different number of columns 120 used as a load for column 118 is within the scope of various embodiments.

A column 118 and a column 120 are each a variation of a column of regular memory cells 122. For example, in a column of regular memory cells, there is no tracking cell 124. That is, the cells coupled to an upper read bit line or a lower read bit line are all regular memory cells 122. The upper read bit lines and the lower read bit lines of a column of regular memory cells 122 are not coupled together.

In some embodiments, memory cells 122 and tracking cells 124 have different read speeds. For simplicity, the discussions in this document related to a cell speed are in the context of a tracking cell 124, but are applicable to a memory cell 122. Generally, a fast or a strong tracking cell has a higher current while a slow or a weak tracking cell has a lower current. In various embodiments, so that a critical read path can be tracked, a lower operational voltage VDDR (not labeled), which is either voltage VDDR1 or VDDR2 (shown in FIGS. 3B and 4B), is used in tracking cells 124. Effectively, a tracking cell 124 having a lower operational voltage VDDR generates a lower current or behaves in a manner similar to a slower or a weak tracking cell.

Various embodiments are advantageous over other approaches because tracking cells 124 having a reduced operational voltage VDDR generate larger tracking timings. As a result, the read timings for the weak memory cells based on the slow tracking timings are also larger. Effectively, the larger timings for weak memory cells are covered by tracking circuit 200.

Exemplary Memory Cell, an Embodiment

Figure 3A:
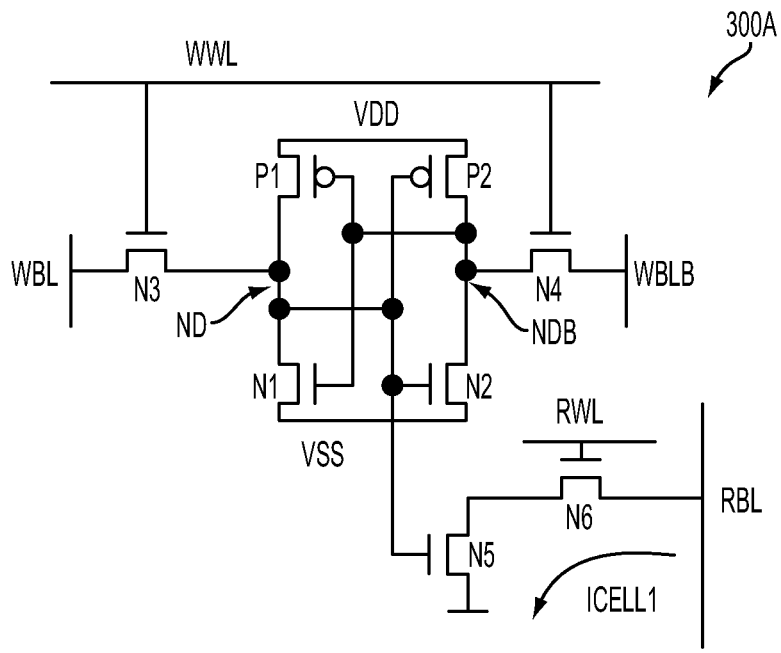
FIG. 3A is a circuit diagram of a memory cell, in accordance with some embodiments.

FIG. 3A is a circuit diagram of a memory cell 300A illustrating an implementation of a memory cell 122, in accordance with some embodiments. Memory cell 300A includes two PMOS transistors P1 and P2, and six NMOS transistors N1, N2, N3, N4, N5, and N6. As a result, memory cell 300A is commonly called an 8-transistor (8° T.) memory cell. Node NVDD (not labeled) that couples the sources of PMOS transistors P1 and P2 is configured to receive operational voltage VDD.

The gates of NMOS transistors N3 and N4 are coupled to a write word line WWL. A write word line WWL is coupled to the gates of transistors N3 and N4 of a plurality of memory cells 300A to a form a row of memory cells.

The gate of transistor N6 is coupled to a read word line RWL. A read word line RWL is coupled to the gates of transistors N6 of the plurality of memory cells 300A that are coupled to a corresponding write word line WWL.

The drain of transistor N6 is coupled to a read bit line RBL. Read bit line RBL is coupled to the drains of a plurality of transistors N6 of a plurality of memory cells 300A to form a regular column, a column 118U, 118L, 120U, or 120L. If memory cell 300A is in a column 118U or a column 120U, read bit line RBL is called upper read bit line UP_TRRBL. But if memory cell 300A is in a column 118L or a column 120L, read bit line RBL is called lower read bit line LO_TRRBL.

The drains of transistors N3 and N4 are coupled to a pair of write bit lines WBL and WBLB, respectively. The pair of write bit lines WBL and WBLB is coupled to the respective drains of transistors N3 and N4 of the plurality of memory cells 300A that are coupled to the corresponding read bit line RBL.

Memory cell 300A has a separate write port and read port. Transistor N3, N4, and write bit lines WBL, WBLB, together, are called a write port of memory cell 300A. In a write operation for memory cell 300A, write word line WWL is activated. The logic values to be written to memory cell 300A are placed at write bit lines WBL and WBLB, which are then transferred or stored at nodes ND and NDB at the sources of transistors N3 and N4, respectively.

Transistors N5, N6, read word line RWL, and read bit line RBL, together, are called a read port of memory cell 300A. In a read operation, read word line RWL is activated to turn on transistor N6. Detecting the voltage value at read line RBL reveals the data stored in nodes NDB and ND.

In some embodiments, prior to transistor N6 being turned on, read bit line RBL is charged to a high logical value. When transistor N6 is turned on, memory cell 300A sinks a current ICELL1 that flows at read bit line RBL or the drain of transistor N6 to the source of transistor N5 or ground. In effect, read bit line RBL is pulled from a high logical value to a low logical value. If memory cell 300A is strong, current ICELL1 is large and read bit line RBL is pulled to ground faster. But if memory cell 300A is weak, current ICELL1 is small and read bit line RBL is pulled to ground slower.

Exemplary Tracking Cell, an Embodiment

Figure 3B:
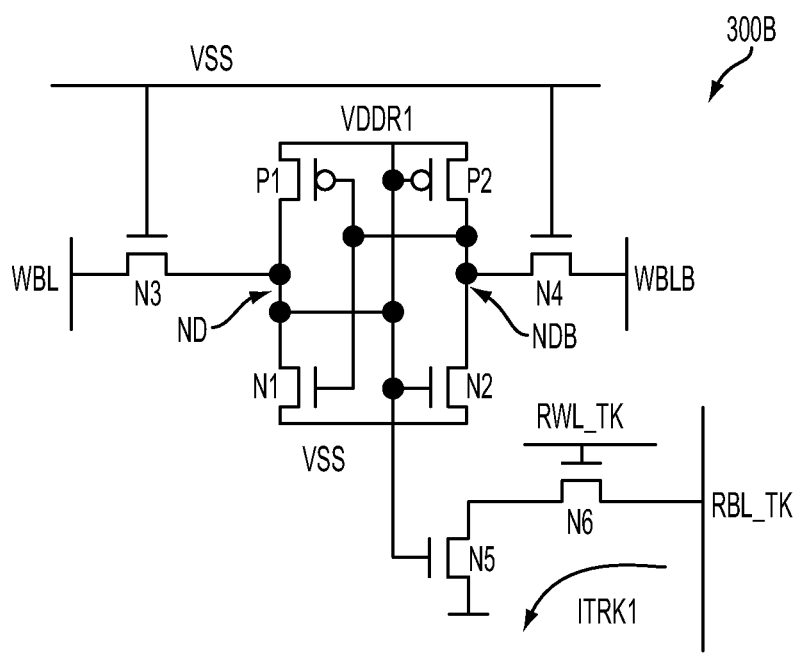
FIG. 3B is a circuit diagram of a tracking cell, in accordance with some embodiments.

FIG. 3B is a circuit diagram of a tracking cell 300B illustrating an embodiment of a tracking cell 124, in accordance with some embodiments. Tracking cell 300B includes circuit elements similar to those of memory cell 300A. Tracking read word line RWL_TK and tracking read bit line RBL_TK correspond to read word line RWL and read bit line RBL in FIG. 3A, respectively. The gates of transistors N3 and N4 are configured to receive reference voltage VSS. The gate of transistors P2, N2, and N5 in tracking cell 300B are configured to receive operational voltage VDDR1. As a result, PMOS transistor P2 in FIG. 3B is always off while NMOS transistors N2 and N5 are always on when voltage VDDR1 is provided. Similar to memory cell 300A, if tracking cell 300B is in a column 118U or a column 120U, tracking read bit line RBL_TK is called upper tracking read bit line UP_TRRBL. But if tracking cell 300B is in a column 118L or a column 120L, read bit line RBL_TK is called lower tracking read bit line LO_TRRBL.

In some embodiments, when tracking read word line RWL_TK is activated, transistor N6 is turned on. Transistors N5 and N6 sink current ITRK1 at the drain of transistor N6 to the source of transistor N5. A strong tracking cell 300B has a larger current ITRK1 while a weak tracking cell 300B has a smaller current ITRK1.

In some embodiments, before transistor N6 is turned on, tracking read bit line RBL_TK is charged to a high logic value. Tracking read bit line RBL_TK is then pulled from a high logic value to a low logic value when transistor N6 is turned on. Further, the sources of transistors P1 and P2 receive reduced voltage VDDR1 at node NVDDR1 (not labeled). As a result, tracking cell 300B is modeled as a slow or a weak tracking cell. Tracking cell 300B also generates timings for a weak memory cell because current ITRK1 is reduced when voltage VDDR1 is reduced compared with voltage VDD. Effectively, tracking read bit line RBL_TK transitions from a high logic value to a low logic value slower than the situation when node NVDDR1 of transistors P1 and P2 receives voltage VDD. Explained in another way, the falling edge of tracking read bit line RBL_TK is delayed. In some embodiments, the falling edge of tracking read bit line RBL_TK triggers the falling edge of tracking read word line RWL_TK. Because the falling edge of tracking read bit line RBL_TK is delayed, the falling edge of tracking read word line RWL_TK is delayed. Effectively, the pulse width of tracking read word line RWL_TK is enlarged. In some embodiments, the falling edge of tracking read word line RWL_TK triggers the falling edge of read word line RWL of a memory cell 300A to be read, which in turns triggers the rising edge of read bit line RBL of the memory cell 300A to be read. Because the pulse width of tracking read word line RWL_TK is enlarged, the pulse width of read word line RWL and of read bit line RBL of the memory cell 300A to be read is enlarged. In other words, the timing for weak memory cells 300A is covered.

Exemplary Memory Cell, Another Embodiment

Figure 4A:
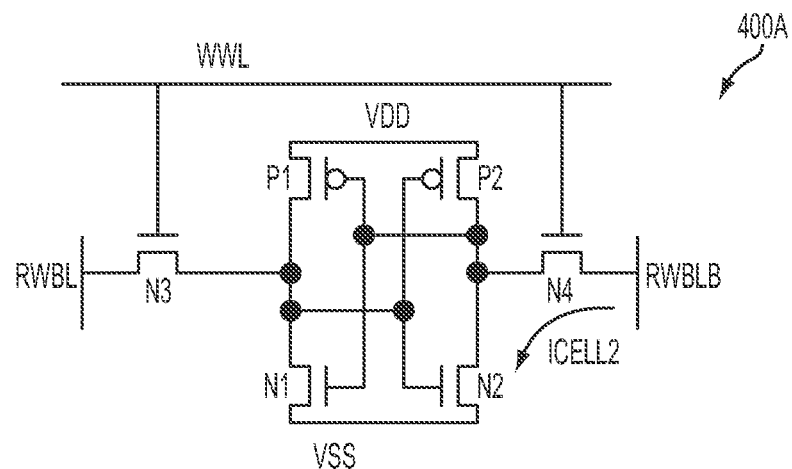
FIG. 4A is a circuit diagram of a memory cell, in accordance with some other embodiments.

FIG. 4A is circuit diagram of a memory cell 400A illustrating another embodiment of a memory cell 122, in accordance with some embodiments. Compared with memory cell 300A, memory cell 400A includes the same two PMOS transistors P1 and P2 and four NMOS transistors N1, N2, N3, and N4 as memory cell 300A. Memory cell 400A, however, does not have transistors N5 and N6 as memory cell 300A does. Effectively, memory cell 400A has six transistors, and is therefore commonly called a 6T memory cell.

Alternatively explained, memory cell 400A does not have a separate read port. The write port and the read port of memory cell 400A are shared and formed by transistors N3 and N4 and read-write bit lines RWBL and RWBLB.

If memory cell 400A is in a column 118U or a column 120U in FIG. 2, read write bit line RWBLB is called upper read bit line UP_TRRBL. But if memory cell 400A is in a column 118L or a column 120L, read write bit line RWBLB is called lower read bit line LO_TRRBL.

Current ICELL2 of memory cell 400A corresponds to current ICELL1 of memory cell 300A. When write word line WWL is activated, transistor N4 is turned on and current ICELL2 flows from the read write bit line RWBLB or the drain of transistor N4 to the source of transistor N2, which is VSS or ground.

Exemplary Tracking Cell, Another Embodiment

Figure 4B:
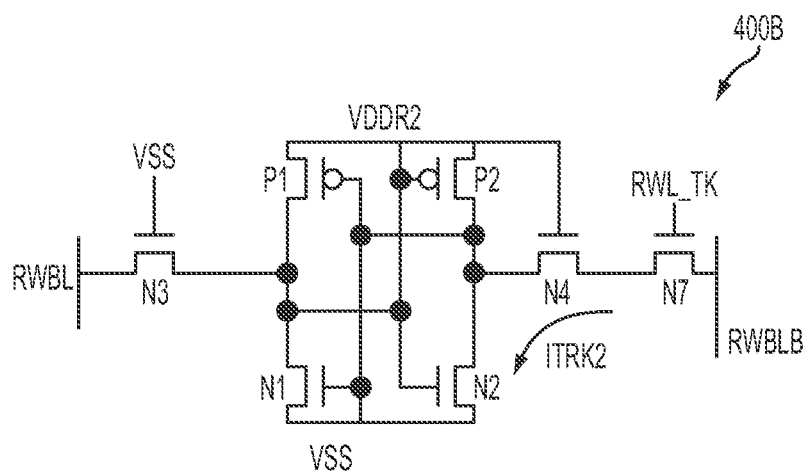
FIG. 4B is a circuit diagram of a tracking cell, in accordance with some other embodiments.

FIG. 4B is circuit diagram of a tracking cell 400B illustrating another implementation of a tracking cell 124, in accordance with some embodiments. In some embodiments, tracking cell 300B in FIG. 3B and memory cell 300A in FIG. 3A are used in the same tracking circuit 200. In contrast, tracking cell 400B is used when memory cell 400A in FIG. 4A is used in tracking circuit 200.

Tracking cell 400B includes circuit elements similar to those of memory cell 400A. Configurations of various circuit elements in tracking cell 400B, however, are different. Tracking cell 400B also includes NMOS transistor N7 that memory cell 400A does not have. The gate of transistor N7 is configured to function as a tracking read word line RWL_TK.

In FIG. 4B, the gate of transistor N3 is configured to receive reference voltage VSS. The gate of transistors P1 and N1 are also configured to receive voltage VSS. Effectively, the gates of transistors P1 and N1 are coupled to the sources of transistors N1 and N2. As a result, when tracking cell 400B is in operation, transistor N1 is always off while transistor P1 is always on.

Similar to memory cell 400A, if tracking cell 400B is in a column 118U or a column 120U in FIG. 2, read write bit line RWBLB is called upper read bit line UP_TRRBL. But if tracking cell 400B is in a column 118L or a column 120L, read write bit line RWBLB is called lower read bit line LO_TRRBL.

In some embodiments, when tracking read word line RWL_TK is activated, transistor N7 is turned on. Transistors N2 and N4 sink current ITRK2 at the drain of transistor N4 to the source of transistor N2. A strong tracking cell 400B has a larger current ITRK2 while a weak tracking cell 400B has a smaller current ITRK2. Current ITRK2 of tracking cell 400B corresponds to current ITRK1 of tracking cell 300B.

In some embodiments, before transistor N7 is turned on, read write bit line RWBLB is charged to a high logic value. Read write bit line RWBLB is then pulled from a high logic value to a low logic value when transistor N7 is turned on. Further, the sources of transistors P1, P2, and the gate of transistor N4 are configured to receive a reduced operational voltage VDDR2 at node NVDDR2 (not labeled). As a result, tracking cell 400B is modeled as a slow or a weak tracking cell 124. Tracking cell 400B also behaves in a manner similar to a weak tracking cell because current ITRK2 is reduced when voltage VDDR2 is reduced compared with voltage VDD. Effectively, read write bit line RWBLB transitions from a high logic value to a low logic value slower than the situation when transistors P1 and P2 receive voltage VDD.

Exemplary LIOs

Figure 5:
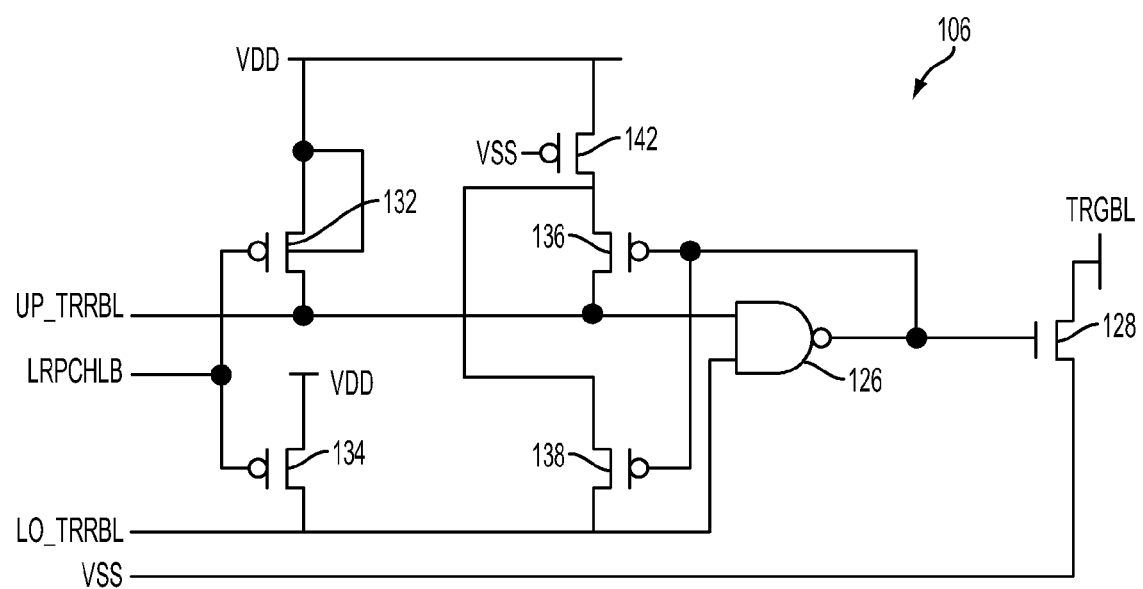
FIG. 5 is a circuit diagram of a local IO, in accordance with some embodiments.

FIG. 5 is a circuit diagram of an LIO 106, in accordance with some embodiments. Transistors in LIO 106, such as transistors 132, 134, 142, etc., are configured to receive regular operational voltage VDD.

Each input of NAND gate 126 is coupled to a read bit line, which, for illustration, is upper read bit line UP_TRRBL and lower read bit line LO_TRRBL. In some embodiments as illustrated in FIG. 2, upper read bit line UP_TRRBL and lower read bit line LO_TRRBL are coupled together. In a regular column that there is no tracking cell 124, upper read bit line is called UP_RBL (not labeled), and lower read bit line is called LO_RBL (not labeled). Upper read bit line UP_RBL and lower read bit line LO_RBL are not coupled together.

The output of NAND gate 126 controls the gate of transistor 128, or, effectively, controls tracking global bit line TRGBL at the drain of transistor 128. Transistors 132, 134, 136, and 138 provide appropriate voltage values to the inputs of NAND gates 126, based on control signal LRPCHLB, operational voltage VDD and reference voltage VSS.

Figure 6:
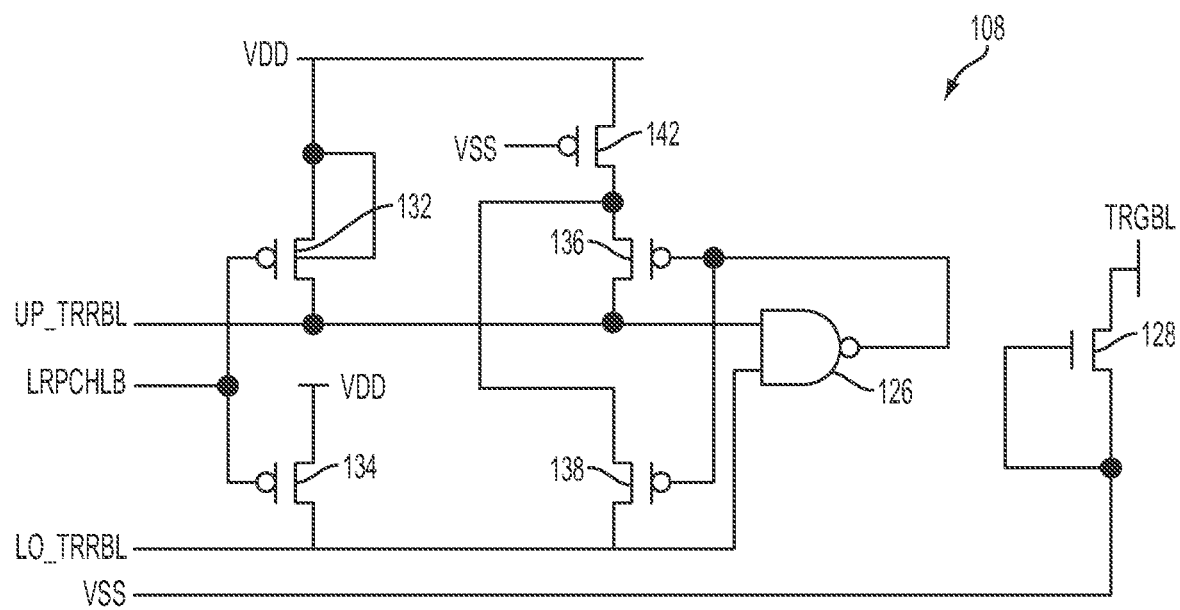
FIG. 6 is a circuit diagram of a local IO, in accordance with some other embodiments.

FIG. 6 is a circuit diagram of an LIO 108, in accordance with some embodiments. An LIO 108 includes circuit components similar to those of an LIO 106. The output of NAND gate 126 in LIO 108, however, is not coupled to the gate of transistor 128. In contrast, the gate of transistor 128 is coupled to the source of transistor 128 or voltage VSS. As a result, transistor 128 is always off and acts as an open circuit. LIO 108 is therefore electrically disconnected from tracking global bit line TRGBL.

Exemplary Tracking Operation

Figure 7A:
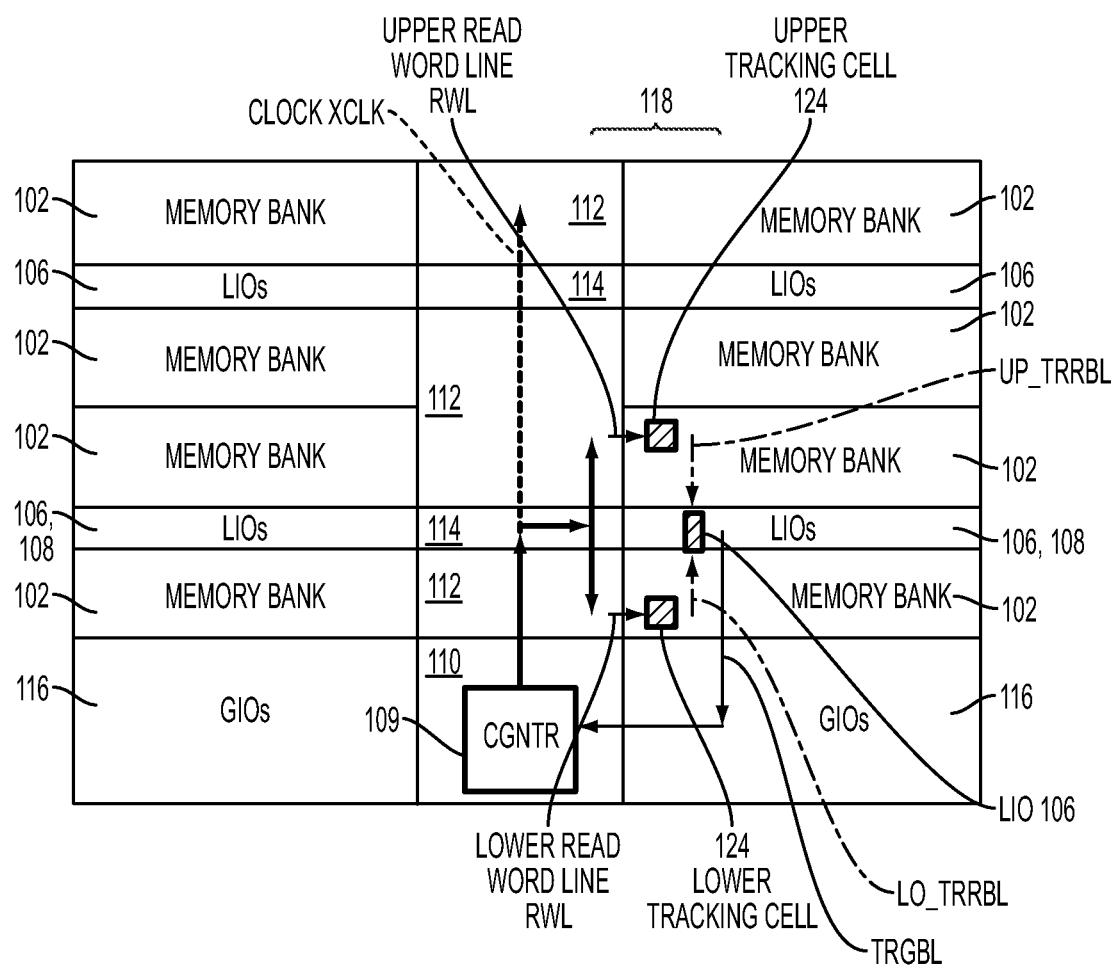
FIG. 7A is a block diagram of a memory macro illustrating a tracking path, in accordance with some embodiments.

FIG. 7A is a block diagram of memory macro 100 used to illustrate a tracking operation, in accordance with some embodiments.

In this illustration, memory cell 300A and tracking cell 300B are used as memory cell 122 and tracking cell 124 in circuit 200, respectively. When memory cells 400A and tracking cells 400B are used as memory cell 122 and tracking cell 124 in tracking circuit 200, the operation of memory cell 400A and tracking cell 400B are similar and should be recognizable by persons of ordinary skill in the art in view of this document.

In some embodiments, tracking global bit line TRGBL transitions from a high logic value to a low logic value. The transition of tracking global bit line TRGBL is caused by an operation of tracking circuit 200 that includes one column 118 and three columns 120 illustratively shown in FIG. 2. For simplicity, some elements of column 118 in FIG. 2 are shown FIG. 7, but three columns 120 are not shown. Effectively, the transition of tracking global bit line TRGBL is caused by the operations of an upper tracking cell 300B and a lower tracking cell 300B illustratively shown in 3B. As a result, tracking read bit line RBL_TK of the upper tracking cell 300B and of the lower tracking cell 300B correspond to upper read tracking bit line UP_TRRBL and lower read tracking bit line LO_TRRBL of column 118U and column 118L, respectively. The transition of tracking global bit line is also caused by the operations of the LIO 106 coupled to upper tracking read bit line UP_TRRBL and lower tracking read bit line LO_TRRBL. The detail of LIO 106 is shown in FIG. 5. In some embodiments, upper tracking read bit line UP_TRRBL, lower tracking read bit line LO_TRRBL, and global tracking bit line GBL are initially pre-charged to a high logical value.

In some embodiments, a rising edge of clock EXCLK causes clock XCLK to rise. Clock XCLK is then transmitted from clock generator 109 through various decoders 112 and local control circuitry LCTRL 114. Based on clock XCLK, LCTRL 114 activates the upper tracking read word line RWL_TK (shown in FIG. 3B) and the lower tracking read word line RWL_TK of the respective upper tracking cell 300B and the lower tracking cell 300B. Tracking read word lines RWL_TK then cause corresponding transistors N6 of upper tracking cell 300B and of lower tracking cell 300B to turn on. As a result, upper tracking read bit line UP_TRRBL and lower tracking read bit line LO_TRRBL are pulled to ground or a low logic value at the source of transistors N5 of upper tracking cell 300B and of lower tracking cell 300B. NAND gate 126 of LIO 106 illustrated in FIG. 5 receives a low logic value of upper tracking read bit line UP_TRRBL and of lower tracking read bit line LO_TRRBL at both inputs. As a result, output of NAND gate 126 at the gate of transistor 128 has a high logic value, which turns on NMOS transistor 128. Because transistor 128 is turned on, tracking global bit line TRGBL is pulled to reference voltage VSS or a low logic value at the source of transistor 128. Effectively, global tracking bit line TRGBL transitions from a high logic value to a low logic value. In some embodiments, global tracking bit line TRGBL is fed to clock generator 109, and causes a tracking reset signal TRRSET (shown in FIG. 8) to also transition from a high to a low logic value. In this document, the high to low transition of global tracking bit line TRGBL 130 and the high to low transition of tracking reset signal TRRSET are used interchangeably.

In some embodiments, the falling edge of tracking global bit line TRGBL 130 causes clocks XCLK and YCLK to fall. Based on the falling edge of clock XCLK, LCTRL 114 causes read word line RWL of the memory cell to be read to rise. The data at node ND or the gate of transistor N5 of the memory cell to be read is reflected on the corresponding read bit line RBL. Through a corresponding local LIO coupling the read bit line RBL and global bit line GBL, the data to be read is transferred from read bit line RBL to the corresponding global bit line GBL, which is then transferred to GIOs 116, and to other circuitries outside of memory macro 100.

Tracking circuits different from tracking circuit 200 in FIG. 2 and/or different tracking paths from the tracking path in FIG. 7A are within the scope of various embodiments. For example, in some embodiments, a tracking circuit travels along the Y-decoder direction in which clock YCLK turns on and off the input-output buffers of GIOs 116.

Figure 7B:
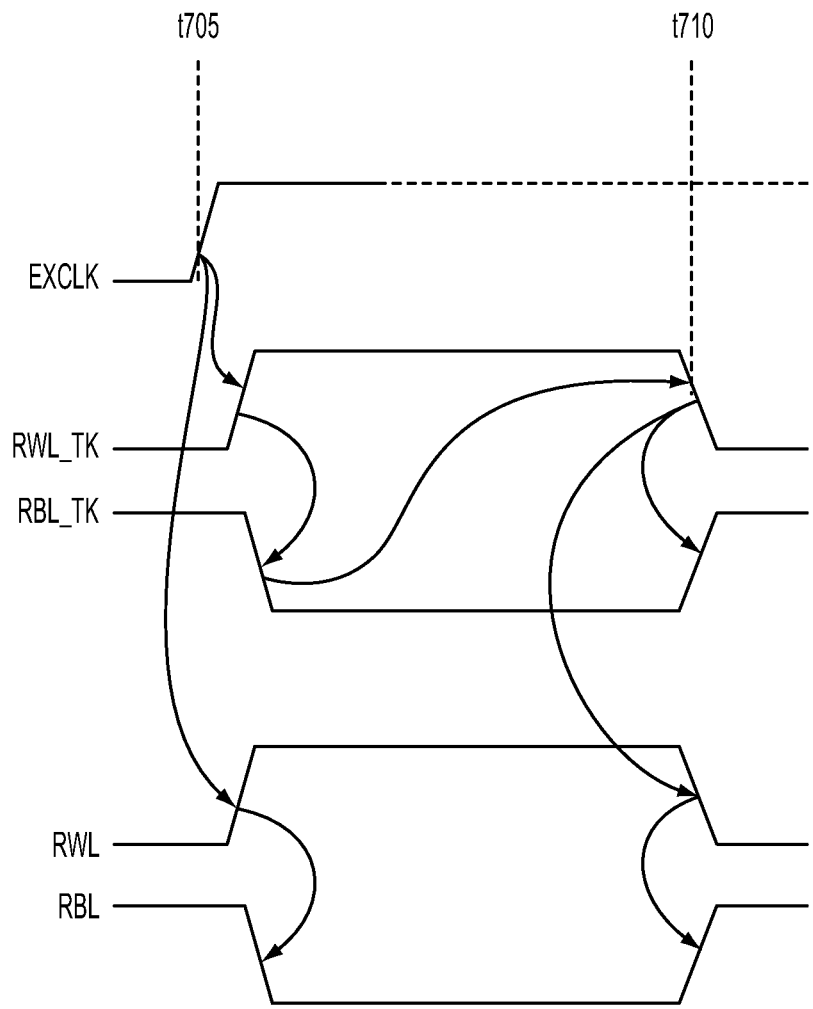
FIG. 7B is a graph of waveforms illustrating the relationships of various waveforms, in accordance with some embodiments.

FIG. 7B is a graph of waveforms illustrating the relationships of various signals, in accordance with some embodiments. In this illustration, when a memory cell 300A is read, tracking circuit 200 having tracking cells 300B is invoked to generate the pulse width of a read word line RWL and a read bit line RBL of the memory cell 300A to be read. The operation of tracking circuit having tracking cells 400B is similar and should be recognizable by persons of ordinary skill in the art in view of this disclosure.

At time t705, a rising edge of clock EXCLK causes tracking read word lines RWL_TK of tracking cells 300B of tracking circuit 200 to rise. For simplicity, one tracking read word line RWL_TK is shown.

The rising edges of tracking read word lines RWL_TK cause tracking read bit lines RBL_TK of tracking cells 300B to fall. For illustration, one tracking read bit line RBL_TK is shown.

The rising edge of clock EXCLK also causes a read word line RWL of the memory cell 300A to be read to rise.

The rising edge of read word line RWL causes read bit line RBL to fall.

At time t710, tracking read word lines RWL_TK fall based on the falling edges of tracking read bit lines RBL_TK. In some embodiments, GCTRL 110 causes tracking read word line RWL_TK to fall after tracking read bit lines RBL_TK fall for a predetermined time.

The falling edges of tracking read word lines RWL_TK cause tracking read bit lines RBL_TK to rise, and read word line RWL to fall.

The falling edge of read word line RWL causes read bit line RBL to rise.

In various embodiments, because voltage VDDR1 at node NVDDR1 is reduced compared with voltage VDD, tracking read bit lines RBL_TK fall slower than the situation when node NVDDR1 is at voltage VDD. In other words, the falling edges of tracking read bit lines RBL_TK are delayed. As a result, the falling edges of tracking read word lines RWL_TK are delayed, which causes the delay in the falling edge of read word line RWL. Effectively, the pulse width of read word line RWL increases, which covers timings for weak memory cells 122. Without the pulse width increase of read word line RWL, the slow transition of read bit line RBL of a weak memory cell 122 may cause reading memory cell 122 to fail.

Voltage VDDR

FIGS. 8A and 8B are tables 800A and 800B, used to illustrate how a reduced operational voltage VDDR for use by tracking cells 124 in tracking circuit 200 is selected.

In the following discussions, for illustration, memory cells 300A and tracking cells 300B are used in memory macro 100 and thus in a tracking circuit 200. The discussions are also applicable when memory cells 400A and tracking cells 400B are used in place of memory cells 300A and tracking cells 300B, respectively.

In some embodiments, at a particular voltage value applied at node NVDDR1, the average current ITRACKING of all tracking cells 300B in a tracking circuit 200 is calculated. For example, current ITOTAL (not labeled) sunk by all tracking cells 300B in circuit 200 is determined. Current ITOTAL is the sum of each current ITRK1 sunk by each tracking cell 300B in circuit 200. In some embodiments, current ITOTAL is pre-determined by a circuit simulation. A current ITRACKING is then calculated by dividing current ITOTAL by the number of tracking cells 300B in tracking circuit 200. As a result, at a particular voltage value applied at node NVDDR1 of tracking cells 300B, there is a corresponding average current ITRACKING.

In some embodiments, a current IWEAK of the weakest cell of all memory cells 300A in memory macro 100 is determined for different voltages. The different voltages are applied at node NVDD having voltage VDD of memory cells 300A. As a result, at a particular voltage applied at node NVDD of memory cells 300A, there is a corresponding current IWEAK.

In some embodiments, current IWEAK is determined based on the 6-sigma value of a plurality of values of current ICELL1 of memory cells 300A. For example, simulation is performed to determine the values of current ICELL1 of all memory cells 300A in memory macro 100 at an operational voltage VDD. Based on the values of current ICELL1, the 6-sigma value is calculated and considered as the value for current IWEAK. The 6-sigma value calculation is not described, but should be recognizable by persons of ordinary skill in the art. Effectively, at a particular voltage value applied at node NVDD of all memory cells 300A in memory macro 100, there is a corresponding value of current IWEAK.

Different ways of determining the value for current IWEAK are within the scope of various embodiments. For example, in some embodiments, the 6-sigma value in addition to the values of current ICELL1 of memory cells 300A, includes the values of current ITRK1 of tracking cells 300B. This is because, as illustrated in FIGS. 3A and 3B, a memory cell 300A and a tracking cell 300B have similar circuit elements. For another example, in some embodiments, a different sigma value, such as 5-sigma, 4-sigma, 3-sigma, 2-sigma, etc., is used instead of the 6-sigma value.

In some embodiments, the reduced voltage VDDR1 for use by tracking cells 300B in tracking circuit 200 is determined based on the plurality of values of current ITRACKING, of current IWEAK, and of corresponding voltages.

For illustration, table 800A shows the values of average current ITRACKING at corresponding voltages applied at node NVDDR1 having voltage VDDR1 of tracking cells 300B in tracking circuit 200. For example, on lines, 805-820, the current values of 30 µA, 20 µA, 10 µA, and 5 µA correspond to the voltage values of 0.9 V, 0.8 V, 0.7 V, and 0.6 V, respectively.

Table 800B shows the values of current IWEAK at the corresponding voltages applied at nodes NVDD of memory cells 300A. For example, on lines 855-870, the current values of 20 µA, 10 µA, 5 µA, and 1 µA correspond to the voltage values of 0.9 V, 0.8 V, 0.7V, and 0.6 V, respectively.

For illustration, a normal operational voltage value VDD for memory cells 300A is 0.9 V. Based on line 855 of table 800B, the voltage value of 0.9 V corresponds to the value of 20 µA of current IWEAK. Based on line 810 of table 800A, a tracking cell 300B in circuit 200 sinks an average current of 20 µA when voltage VDDR1 is at 0.8 V. In some embodiments, 0.8 V is selected as the value of voltage VDDR1 for use by tracking cells 300B in circuit 200. In effect, the current applied at node NVDDR1 of tracking cell 300B is 0.8 V, which is reduced compared with the normal operational voltage VDD of 0.9 V. In other words, each tracking cell 300B, on the average, behaves in a manner similar to a weak tracking cell.

In some embodiments, the data in table 800A and 800B are analyzed. Voltage VDDR is then chosen by reducing voltage VDD by a predetermined voltage value, such as −100 mV, −200, mV, −300 mV, etc. Alternatively, voltage VDDR is chosen as a percentage of voltage VDD, such as 70%, 80%, 90%, etc., of voltage VDD. In some embodiments, voltage VDDR is selected such that the current value of current ITRACKING for tracking bit cells 124 is close to the 6-sigma value of the current values of memory cells 122 in memory macro 100. Alternatively and/or additionally, voltage VDDR is selected such that tracking cells 124 cover the timing for the weak (weakest) memory cells 122.

In some embodiments, a first voltage source provides voltage VDD while a second voltage source provides voltage VDDR. In some embodiments, voltage VDDR is derived from voltage VDD.

Figure 8C:
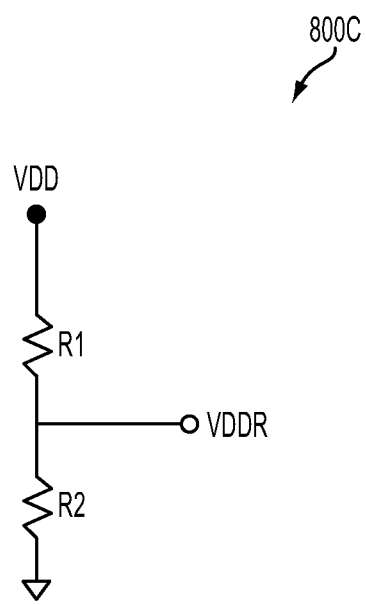
FIG. 8C is an exemplary circuit illustrating how a reduced operational voltage for a tracking cell is generated based on a regular operational voltage, in accordance with some embodiments.

FIG. 8C is a diagram of a circuit 800C, illustrating how voltage VDDR is derived from voltage VDD, in accordance with some embodiments. Those of ordinary skill in the art will recognize that circuit 800C is a voltage divider. Resistors R1 and R2 are selected to provide the desired voltage VDDR with reference to voltage VDD, based on the equations $$VDDR=(R2/(R1+R2))VDD$$

Different circuits used to derive voltage VDDR from voltage VDD are within the scope of various embodiments.

Exemplary Method

Figure 9:
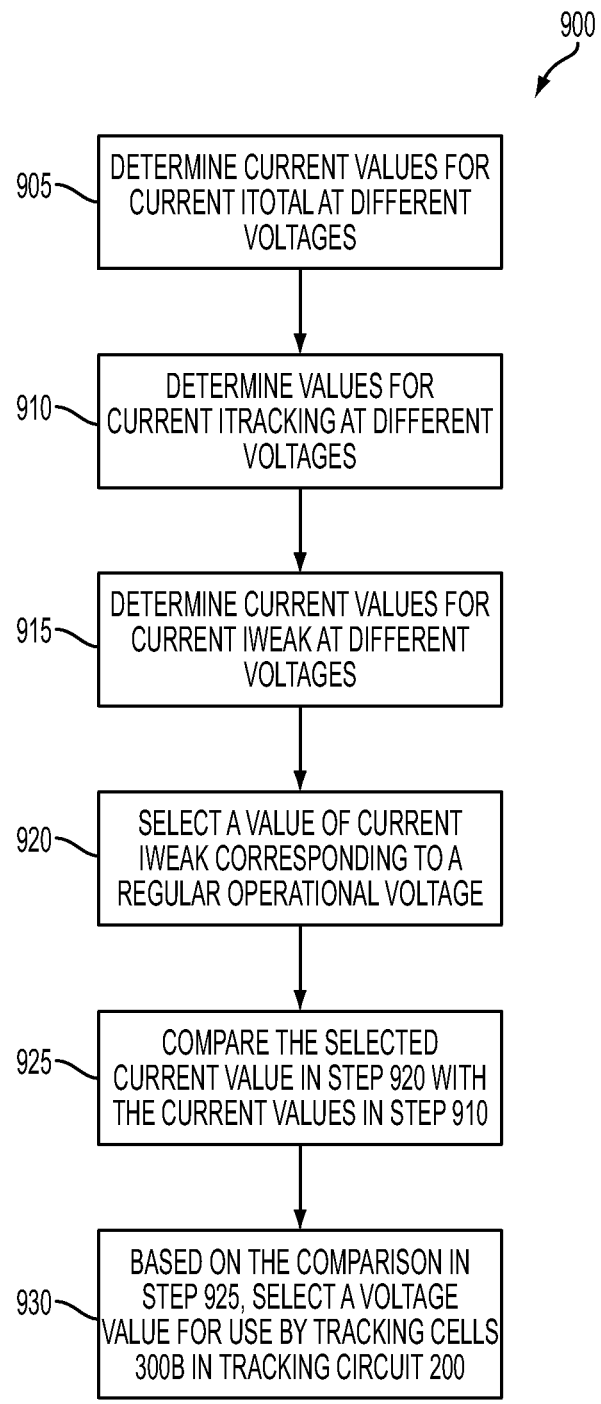
FIG. 9 is a flow chart of a method illustrating how a reduced operational voltage for a tracking cell is selected, in accordance with some embodiments.

FIG. 9 is a flowchart 900 illustrating how a value of voltage VDDR1 of tracking cells 300B in tracking circuit 200 is selected, in accordance with some embodiments. A value of voltage VDDR2 of tracking cells 400B is selected in a similar manner.

In step 905, currents ITOTAL of tracking circuit 200 are determined for a plurality of voltages applied at node NVDDR1 of tracking cells 300B. In some embodiments, currents ITOTAL are determined by simulation.

In step 910, the values of current ITRACKING corresponding to the plurality of voltages applied at node NVDDR1 are determined. For illustration, table 800A includes the various values of current ITRACKING and corresponding voltages.

In step 915, the values of current IWEAK at different voltages are determined. For illustration table 800B includes the various values of current IWEAK and corresponding voltages.

In step 920, the data in tables 800A and 800B are analyzed. For illustration, the regular operational voltage VDD is 0.9 V. Based on table 800B, the current value of 20 µA corresponding to a regular operational voltage VDD of 0.9 V is selected.

In step 925, the selected value 20 µA in table 800B is used to compare against the values of current ITRACKING in table 800A.

In step 930, the current value of 20 µA in table 800B matches the current value of 20 µA in table 800A, which corresponds to the voltage value of 0.8 V. As a result, 0.8 V is selected as voltage VDDR1 for nodes NVDDR1 of tracking cells 300B in tracking circuit 200.

In FIGS. 8A, 8B, and 9, the value 20 µA of current IWEAK in table 800B matches the value 20 µA of ITRACKING in table 800A. If there is no value of current ITRACKING in table 800A that matches the selected value of current TWEAK in table 800B, the selected voltage VDDR1 is adjusted accordingly. For example, the value of current TWEAK on line 855 of table 800B that corresponds to an operational voltage of 0.9 V is 22 µA, instead of 20 µA. The value of 22 µA does not match any value of current ITRACK-ING in table 800 A. The value of 22 µA, however, is in between the values of 20 µA and 30 µA that correspond to voltages 0.8 V and 0.9 V, respectively. As a result, a value in between 0.8 V and 0.9 V, such as 8.2 V, is selected as voltage VDDR1.

A number of embodiments have been described. It will nevertheless be understood that various modifications may be made without departing from the spirit and scope of the disclosure. For example, the various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logic level (e.g., Low or High) of the various signals used in the above description is also for illustration purposes. Various embodiments are not limited to a particular level when a signal is activated and/or deactivated. Selecting different levels is within the scope of various embodiments.

In some embodiments, a method includes determining a plurality of first current values of a first current to be sunk by a tracking cell of a tracking circuit in response to a plurality of first voltage values of a first voltage applied to the tracking cell. Each first current value of the plurality of first current values thereby corresponds to a first voltage value of the plurality of first voltage values. A second current value of a second current is determined. The second current value corresponds to a second voltage value of a second voltage of a memory cell of a plurality of memory cells. A third voltage value is selected based on the second current value, a first current value of the plurality of first current values, and a first voltage value corresponding to the first current value. The selected third voltage value is for use in a tracking cell of the tracking circuit for generating a tracking signal for a memory cell to be accessed of the plurality of memory cells.

In some embodiments, a method includes determining average cell current values of a tracking circuit of a memory circuit corresponding to sample voltage values of a first operational voltage of the tracking circuit based on a first simulation result. A weak cell current value of a plurality of memory cells of the memory circuit is determined, and the weak cell current value corresponds to a predetermined voltage value of a second operational voltage of the plurality of memory cells based on a second simulation result. One of the average cell current values is identified, and the identified one of the average cell current values is closest to the weak cell current value among the average cell current values or less than the weak cell current value. A circuit is configured to output the first operational voltage that has one of the sample voltage values corresponding to the identified average cell current value.

In some embodiments, a method includes determining a plurality of average cell current values of a tracking cell of a tracking circuit corresponding to a plurality of sample voltage values of a first operational voltage at a power node of the tracking cell. The tracking circuit is configured to generate a tracking signal responsive to an instruction to access a memory cell of a plurality of memory cells. A weak cell current value representative of a weak cell current of the plurality of memory cells is determined, and the weak cell current value corresponds to a predetermined voltage value of a second operational voltage at a power node of the plurality of memory cells. A final voltage value of the first operational voltage is determined based on comparing the weak cell current value and the plurality of average cell current values.

The various figures show the resistive circuit using discrete resistors for illustration only, equivalent circuitry may be used. For example, a resistive device, circuitry or network (e.g., a combination of resistors, resistive devices, circuitry, etc.) can be used in place of the resistor.

The above methods show exemplary steps, but the steps are not necessarily performed in the order shown. Steps may be added, replaced, changed order, and/or eliminated as appropriate, in accordance with the spirit and scope of disclosed embodiments.

What is claimed is:

1. A method comprising:
   determining a plurality of first current values of a first current to be sunk by a tracking cell of a tracking circuit in response to a plurality of first voltage values of a first voltage applied to the tracking cell, each first current value of the plurality of first current values thereby corresponding to a first voltage value of the plurality of first voltage values;
   determining a second current value of a second current corresponding to a second voltage value of a second voltage of a memory cell of a plurality of memory cells; and
   selecting a third voltage value based on the second current value, a first current value of the plurality of first current values, and a first voltage value corresponding to the first current value,
   wherein
   the selected third voltage value is for use in a tracking cell of the tracking circuit for generating a tracking signal for a memory cell to be accessed of the plurality of memory cells.

2. The method of claim 1, wherein the second current value is determined based on a plurality of second current values of the plurality of memory cells.

3. The method of claim 2, wherein the second current value is selected from the group consisting of a first sigma value, a second sigma value, a third sigma value, a fourth sigma value, a fifth sigma value, and a sixth sigma value of the plurality of second current values.

4. The method of claim 1, wherein each first current value of the plurality of first current values is determined based on a total current value of a plurality of tracking cells of the tracking circuit.

5. The method of claim 1, wherein the selected third voltage value is a percentage of the second voltage value and/or a reduction from the second voltage value.

6. The method of claim 1, wherein the selected third voltage value is generated by a circuit having the second voltage value as an input.

7. The method of claim 1, wherein, in a read operation of a first memory cell of the plurality of memory cell, the tracking circuit generates an edge of a tracking signal based on which an edge of a read word line for the first memory cell is generated.

8. A method comprising:
   determining average cell current values of a tracking circuit of a memory circuit corresponding to sample voltage values of a first operational voltage of the tracking circuit based on a first simulation result;
   determining a weak cell current value of a plurality of memory cells of the memory circuit corresponding to a predetermined voltage value of a second operational voltage of the plurality of memory cells based on a second simulation result;
   identifying one of the average cell current values that is closest to the weak cell current value among the average cell current values or less than the weak cell current value; and
   configuring a circuit to output the first operational voltage that has one of the sample voltage values corresponding to the identified average cell current value.

9. The method of claim 8, further comprising:
   arranging the average cell current values of the tracking circuit and the sample voltage values of the first operational voltage of the tracking circuit as a table.

10. The method of claim 9, further comprising
    determining the identified average cell current value and one of the sample voltage values corresponding to the identified average cell current value from the table using the weak cell current value as an index.

11. The method of claim 8, wherein the determining the weak cell current value of the plurality of memory cells is performed based on a plurality of cell current values of the plurality of memory cells.

12. The method of claim 11, wherein the weak cell current value is a first sigma value, a second sigma value, a third sigma value, a fourth sigma value, a fifth sigma value, or a sixth sigma value of the plurality of cell current values.

13. The method of claim 8, wherein the determining average cell current values of the tracking circuit comprises:
    determining a total cell current value of a plurality of tracking cells of the tracking circuit.

14. The method of claim 8, wherein the configuring a circuit to output the first operational voltage that has the one of the sample voltage values corresponding to the identified average cell current value comprises:
    setting the second operational voltage as an operational voltage of the circuit.

15. A method comprising:
    determining a plurality of average cell current values of a tracking cell of a tracking circuit corresponding to a plurality of sample voltage values of a first operational voltage at a power node of the tracking cell, the tracking circuit being configured to generate a tracking signal responsive to an instruction to access a memory cell of a plurality of memory cells;
    determining a weak cell current value representative of a weak cell current of the plurality of memory cells corresponding to a predetermined voltage value of a second operational voltage at a power node of the plurality of memory cells; and
    determining a final voltage value of the first operational voltage based on comparing the weak cell current value and the plurality of average cell current values.

16. The method of claim 15, further comprising
    configuring a circuit to output the first operational voltage having the final voltage value generated based on the second operational voltage.

17. The method of claim 15, wherein the weak cell current value is determined based on a plurality of cell current values of the plurality of memory cells.

18. The method of claim 17, wherein the weak cell current value is a first sigma value, a second sigma value, a third sigma value, a fourth sigma value, a fifth sigma value, or a sixth sigma value of the plurality of cell current values.

19. The method of claim 15, wherein the plurality of average cell current values is determined based on a total cell current value of a plurality of tracking cells of the tracking circuit.

20. The method of claim 15, further comprising:
    arranging the average cell current values of the tracking circuit and the sample voltage values of the first operational voltage of the tracking circuit as a table, wherein the determining the final voltage value of the first operational voltage comprises selecting the final voltage value from the table using the weak cell current value as an index.

* * * * *